(12) United States Patent
Shokouhi

(10) Patent No.: US 6,369,612 B1
(45) Date of Patent: Apr. 9, 2002

(54) HIGH VOLTAGE LEVEL-SHIFTER WITH TRI-STATE OUTPUT DRIVER

(75) Inventor: Farshid Shokouhi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/626,697

(22) Filed: Jul. 27, 2000

(51) Int. Cl.$^7$ .............................................. H03K 19/094
(52) U.S. Cl. ............................ 326/68; 326/80; 327/333
(58) Field of Search .............................. 326/62, 63, 68, 326/80, 81; 327/333

(56) References Cited

U.S. PATENT DOCUMENTS

| | | | |
|---|---|---|---|
| 5,528,172 A | | 6/1996 | Sundstrom .................... 326/80 |
| 5,680,068 A | * | 10/1997 | Ochi et al. ................... 327/333 |
| 5,739,700 A | * | 4/1998 | Martin | |
| 5,986,472 A | * | 11/1999 | Hinedi et al. ................. 326/68 |

* cited by examiner

*Primary Examiner*—Tuan T. Lam
(74) *Attorney, Agent, or Firm*—Bever Hoffman & Harms

(57) ABSTRACT

A high voltage level-shifter that facilitates the conversion of typical positive logic input signal voltages to non-positive (i.e., at or below ground) output signal voltages. The high voltage level-shifter is separated into two voltage shifting circuits that are connected in parallel between a circuit input terminal and a circuit output terminal. The first voltage shifting circuit includes an isolation switch (e.g., a pass transistor) connected between a positive voltage source and a positive supply rail of an output driver. The negative supply rail of the output driver is connected to one of the non-positive voltage sources. An output control circuit controls the isolation switch to couple the positive voltage source to the positive supply rail of the output driver only when the negative voltage source is driven onto the circuit output terminal (i.e., in response to a logic "1" input signal).

20 Claims, 3 Drawing Sheets

HIGH VOLTAGE LEVEL-SHIFTER WITH TRI-STATE OUTPUT DRIVER

FIELD OF THE INVENTION

The present invention relates to level-shifters and, more particularly, to high voltage level-shifters utilized in integrated circuits that utilized both positive and negative operating voltages.

DISCUSSION OF RELATED ART

Digital devices typically employ voltage-sensitive binary logic. In binary logic devices, one voltage level represents a logic "0" or "low" while a different voltage level represents a logic "1" or "high". In typical positive logic, the lower voltage level (e.g., ground) represents the logic "0" and the higher voltage level (e.g., 3.3 Volts) represents a logic "1". In negative logic, the reverse is true.

A problem arises when digital devices within an electronic system often have different operating voltages (i.e., different voltage levels representing logic "1"). Variations in fabrication techniques have lead to digital devices using ever-decreasing operating voltages, and hence ever changing logic "1" voltage levels. Accordingly, when several digital devices are combined to form an electronic system, one device may use 5 Volts to represent a logic "1", while another device may use 3.3 Volts. These differences in operating voltages create communication problems because the logic "1" signal output from one digital device may have too low of a voltage level to be interpreted as a logic "1" by another digital device in the system.

Level-shifters are circuits that facilitate communication between various digital devices by "shifting" the logic "1" voltage levels output from one digital device to the voltage levels used by another device. A level-shifter that is incorporated in a digital device typically includes an output driver whose positive and negative supply rails are coupled to voltage supplies maintained at the operating voltage levels used in the digital device. Signals applied to the input terminal of the output driver are used to connect either the positive supply rail or the negative supply rail to its output terminal, thereby "shifting" input signals to the voltage levels used in the digital device.

In addition to inter-device communications, high voltage level-shifters may be used in a device to switch between high voltage levels needed, for example, to program and erase electrically erasable programmable floating gate memory devices. In these applications, high voltage level shifters typically operate in essentially the same manner as that described above to shift low voltage data signals to high voltage program/erase signals. For example, during programming, data values are transmitted within the device using typical positive logic signals (e.g., 3.3 Volts represents logic "1", and 0 Volts represents logic "0"), and are then shifted to the appropriate programming voltages (e.g., 5 Volts or 10 Volts), depending upon the data value stored in the flash memory cells.

A problem with prior art level-shifters arises when both output signal voltages are non-positive (i.e., either both below ground, or one at ground and the other below ground). For example, both positive and negative voltages are used to program some electrically erasable programmable floating gate memory devices to reduce the stress on chip elements by minimizing voltage magnitudes while maximizing the voltage potential used to program/erase the flash memory cells. During programming, data values are typically supplied using typical positive logic signals (e.g., 3.3 Volts represents logic "1", and 0 Volts represents logic "0"), and then must be converted to the appropriate negative voltage (e.g., either −2 Volts or −8 Volts), depending upon the data value stored in the flash memory cells. The problem arises because conventional level-shifters, which utilize one positive voltage and ground, are not able to convert a positive voltage input signal to a negative voltage output signal.

What is needed is a high voltage level shifter that is able to convert positive voltage input signals negative voltage output signals.

SUMMARY OF THE INVENTION

The present invention provides a high voltage level-shifter that facilitates the conversion of typical positive voltage input signals to non-positive voltage (i.e., at or below ground) output signals. The high voltage level-shifter is separated into two parts referred to herein as "voltage shifting circuits" that are connected in parallel between a circuit input terminal and a circuit output terminal. The first voltage shifting circuit includes an output driver that transmits a first negative voltage signal on the circuit output terminal when the circuit input terminal receives an input signal having a first voltage level (e.g., logic "1"). Similarly, the second voltage shifting circuit transmits a second negative voltage (or ground) signal on the circuit output terminal when the input signal has a second voltage level (e.g., logic "0").

In accordance with the present invention, the first voltage shifting circuit includes an isolation switch (e.g., a pass transistor) connected between a positive voltage source and a positive supply rail of the output driver. The negative supply rail of the output driver is connected to the first negative voltage source. An output control circuit controls the isolation switch to couple the positive voltage source to the positive supply rail of the output driver only when the negative voltage source is driven onto the circuit output terminal (e.g., in response to a logic "1" input signal). Conversely, when the circuit input terminal receives a logic "0" input signal, the output control circuit opens the isolation switch to decouple the positive voltage source from the positive supply rail of the output driver, thereby causing the positive supply rail to float. In addition, the output control circuit biases the output driver to couple the circuit output terminal to the floating positive supply rail, thereby effectively "tri-stating" the output driver. At the same time, the second voltage shifting circuit connects the circuit output terminal to the second negative voltage source (or ground). By decoupling the positive supply rail of the output driver in the first voltage shifting circuit, current flow from the positive voltage source to the second negative voltage source (or ground) is prevented.

BRIEF DESCRIPTION OF THE DRAWINGS

The advantages, features and design of the invention will become apparent from the following detailed description of the invention and the accompanying drawings in which like reference numerals refer to like elements and in which.

DETAILED DESCRIPTION

Figure 1:
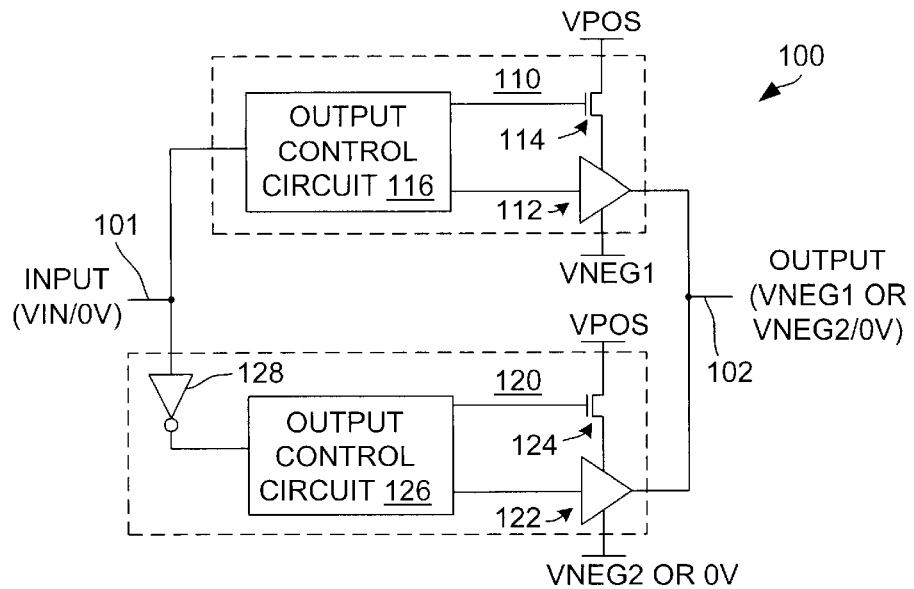
FIG. 1 is a simplified block diagram showing a high voltage level shifter according to an embodiment of the present invention.

FIG. 1 is a block diagram showing a high voltage level shifter 100 according to an embodiment of the present invention. High voltage level shifter 100 includes a pair of voltage shifting circuits 110 and 120 that are connected in parallel between a circuit input terminal 101 and a circuit output terminal 102. As indicated in FIG. 1, an input signal having either a positive voltage VIN (representing, e.g., a logic "1" data value) or 0 Volts (representing, e.g., a logic "0" data value) is applied to circuit input terminal 101, and is converted by first voltage shifting circuit 110 and second voltage shifting circuit 120 to produce an output signal having either a first negative voltage (VNEG1) or a second negative voltage (VNEG2) (one of the two negative voltages may also be ground 0 Volts)). Specifically, voltage shifting circuit 110 transmits a first negative voltage signal (VNEG1) onto circuit output terminal 102 when the input signal is 0 Volts (e.g., logic "0"), and voltage shifting circuit 120 transmits a second negative voltage signal (VNEG2) or ground (0 Volts) onto circuit output terminal 102 when the input signal is VIN (e.g., logic "1").

Referring to the upper portion of FIG. 1, voltage shifting circuit 110 includes an output driver 112, an isolation switch 114, and a output control circuit 116.

Output driver 112 (e.g., a buffer or inverter) has an input terminal connected to receive data values from output control circuit 116, and an output terminal connected to circuit output terminal 102. In addition, output driver 112 has a negative (first) supply rail connected to first negative voltage source VNEG1, and a positive supply rail connected to the lower terminal of isolation switch 114. According to known techniques, depending upon the data value received from output control circuit 116, output driver 112 couples its negative supply rail (i.e., first negative voltage source VNEG1) or its positive supply rail to circuit output terminal 102. For example, when a logic "1" (or "0") is applied to the input terminal of output driver 112, output driver 112 couples the positive supply rail (or negative supply rail) to circuit output terminal 102. Alternatively, when a logic "0" (or "1") is applied to the input terminal of output driver 112, output driver 112 couples the negative supply rail (or positive supply rail) to circuit output terminal 102.

In accordance with the present invention, isolation switch 114, which is connected between positive voltage source VPOS and the positive supply rail of output driver 112, is closed (turned on) by output control circuit 116 when output driver 112 transmits first negative voltage VNEG1 onto circuit output terminal 102, and is opened (turned off) by output control circuit 116 when output driver 112 couples its positive supply rail to circuit output terminal 102.

For example, when a logic "1" input signal is applied to circuit input terminal 101, output control circuit 116 transmits appropriate control signals to output driver 112 and to isolation switch 114. The control signal supplied to output driver 112 causes output driver 112 to couple first negative voltage VNEG1 onto circuit output terminal 102, and the control signal supplied to isolation switch 114 causes isolation switch 114 to close, thereby coupling positive voltage VPOS to the positive supply rail of output driver 112. Coupling positive voltage source VPOS to output driver 112 in this situation facilitates optimal operation of output driver 112 to drive first negative voltage VNEG1 onto circuit output terminal 102.

Conversely, when a logic "0" input signal is applied to circuit input terminal 101, output control circuit 116 transmits a control signal to isolation switch 114 that causes isolation switch 114 to open, thereby causing the positive supply rail of output driver 112 to float. Output control circuit 116 also transmits a control signal to the input terminal of output driver 112, thereby causing output driver 112 to couple its floating positive supply rail to circuit output terminal 102. Note that the logic "0" input signal is also supplied to second voltage shifting circuit 120, which, in response, couples circuit output terminal 102 to the second negative voltage source VNEG2 (or ground). By opening isolation switch 114 when second voltage VNEG2 (or 0 Volts) is driven onto circuit output terminal 102, isolation switch 114 functions to, in effect, tri-state output driver 112, thereby preventing current flow from positive voltage source VPOS to the second negative voltage VNEG2 (or ground). Accordingly, isolation switch 114 selectively couples and decouples positive voltage source VPOS to facilitate the generation of first negative voltage VNEG1 on circuit output terminal 102 in a first operating mode, and to prevent current flow and/or voltage irregularities when second negative voltage VNEG2 (or 0 Volts) is generated at circuit output terminal 102 in a second operating mode.

Referring to the bottom of FIG. 1, in accordance with the first embodiment, second voltage shifting circuit 120 is similar to first voltage shifting circuit 110 in that it includes a second output driver 122, a second isolation switch 124, and a second output control circuit 126 that are connected in the manner described above. However, as mentioned above, second voltage shifting circuit 120 transmits second negative voltage VNEG2 (or ground) onto circuit output terminal 102 in the second operating mode (i.e., when the output terminal of output driver 112 is floating). Accordingly, second voltage shifting circuit 120 is depicted as including an inverter 128, which indicates that the operation of output control circuit 126 during a given operating mode is opposite to that of output control circuit 116 (which is described above). Note that second voltage shifting circuit 120 need not be otherwise identical to first voltage shifting circuit 110, as suggested in the following embodiment.

Figure 2:
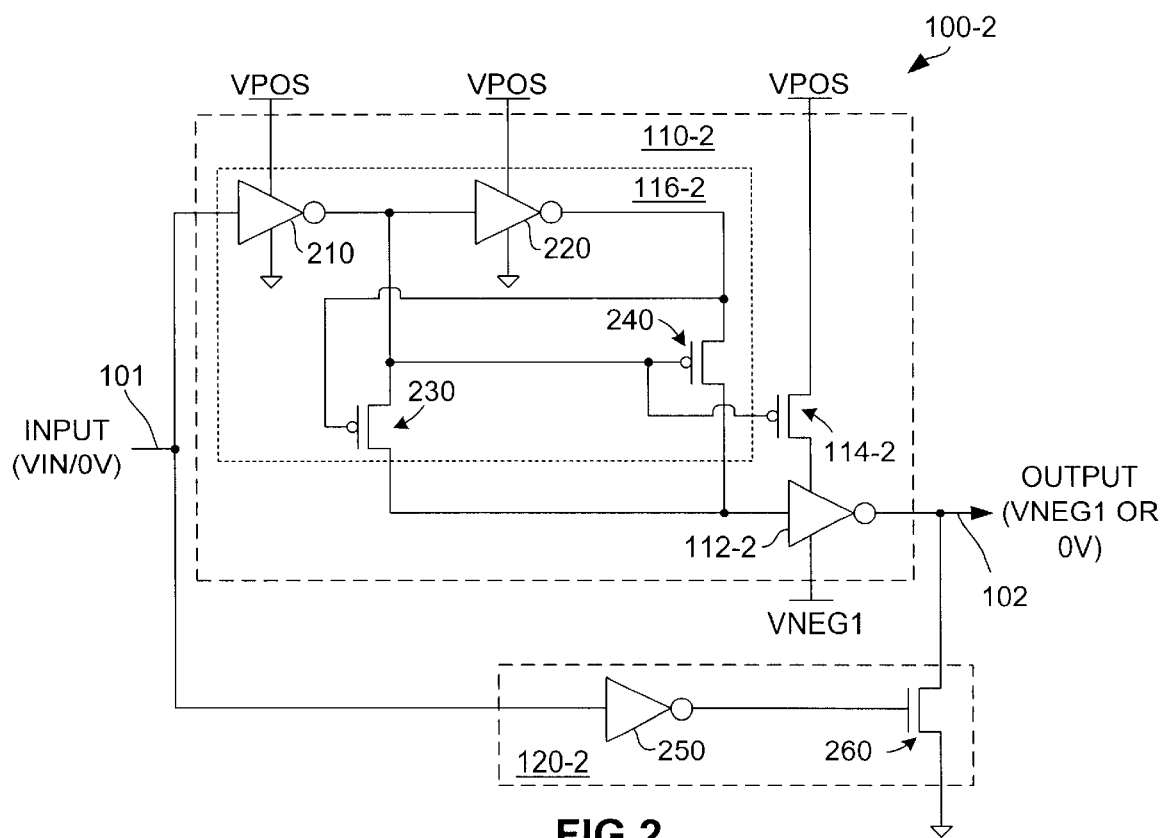
FIG. 2 is a simplified circuit diagram showing a high voltage level shifter according to another embodiment of the present invention.

FIG. 2 is a simplified circuit diagram showing a high voltage level shifter 100-2 according to a second embodiment of the present invention. High voltage level shifter 100-2 includes a first voltage shifting circuit 110-2 that is connected in parallel to a second voltage shifting circuit 120-2 between circuit input terminal 101 and circuit output terminal 102.

Referring to upper portion of FIG. 2, first voltage shifting circuit 110-2 includes an output driver 112-2, an isolation switch 114-2, and an output control circuit 116-2.

Output driver 112-2, which in the present embodiment is inverting, has an input terminal connected to output control circuit 116-2, an output terminal connected to circuit output terminal 102, a positive supply rail connected to the lower terminal of PMOS pass transistor 114-2, and a negative supply rail connected to negative voltage source VNEG1. The function and operation of output driver 112-2 are similar to those described above with reference to output driver 112 (see FIG. 1).

Isolation switch 114-2 is a PMOS pass transistor connected between positive voltage source VPOS and the positive supply rail of output driver 112-2, and has a gate connected to output control circuit 116-2. The function and operation of isolation switch 114-2 are essentially the same as that described above with reference to isolation switch 114 (see FIG. 1).

Output control circuit 116-2 includes a first inverter (buffer) 210, a second inverter (buffer) 220, a first PMOS pass transistor 230, and a second PMOS pass transistor 240. First inverter 210 has an input terminal connected to circuit input terminal 101, and an output terminal connected to the input terminal of second inverter 220, to the upper terminal of first pass transistor 230, and to the gates of second pass transistor 240 and isolation switch 114-2. The output terminal of second inverter 220 is connected to the upper terminal of second pass transistor 240 and the gate terminal of first pass transistor 230. The lower terminals of first pass transistor 230 and second pass transistor 240 are connected to the input terminal of output driver 112-2. Note that, unlike output driver 112-2, the negative supply rails of first inverter 210 and second inverter 220 are connected to ground. However, like output driver 112-2, the positive supply rails of first inverter 210 and second inverter 220 are connected to positive voltage source VPOS.

Referring to the lower portion of FIG. 2, second voltage shifting circuit 120-2 comprises a third inverter 250 whose input is connected to circuit input terminal 101 and whose output terminal is connected to the gate terminal of an NMOS pass transistor 260, which is connected between circuit output terminal 102 and ground.

During a first operating mode (i.e., when a high voltage input signal is supplied to circuit input terminal 101), first voltage shifting circuit 110-2 couples negative voltage source VNEG1 to circuit output terminal 102 in the following manner. First, the high voltage (logic "1") input signal is inverted by first inverter 210, and the resulting low voltage signal is applied to the input terminal of second inverter 220, the upper terminal of first pass transistor 230, and the gate terminals of second pass transistor 240 and isolation switch 114-2. In addition, the low voltage signal applied to the input terminal of second inverter 220 is inverted, and the resulting high voltage signal is applied to the gate terminal of first pass transistor 230 and to the upper terminal of second pass transistor 240. Under these operating conditions, first pass transistor 230 is turned off, second pass transistor 240 is turned on, thereby passing the high output voltage from second inverter 220 to the input terminal of output driver 112-2, and isolation switch 114-2 is turned on, thereby coupling positive voltage source VPOS to the positive supply rail of output driver 112-2. Accordingly, output driver 112-2 (because it is inverting) couples negative voltage source VNEG1 to circuit output terminal 102.

Note that, in the first operating mode, third inverter 250 of second voltage shifting circuit 120-2 applies a low voltage signal to the gate terminal of NMOS pass transistor 260, thereby opening NMOS pass transistor 260 and isolating circuit output terminal 102 from ground.

Conversely, during a second operating mode, (i.e., when a low voltage (logic "0") input signal is supplied to circuit input terminal 101), first voltage shifting circuit 110-2 couples its positive supply rail (which is floating, as described below) to circuit output terminal 102, and third inverter 250 of second voltage shifting circuit 120-2 applies a high voltage signal to the gate terminal of NMOS pass transistor 260, thereby closing NMOS pass transistor 260 to couple circuit output terminal 102 to ground. Referring to first voltage shifting circuit 110-2, the low voltage input signal is inverted by first inverter 210, and the resulting high voltage signal is applied to the input terminal of second inverter 220, the upper terminal of first pass transistor 230, and the gate terminals of second pass transistor 240 and isolation switch 114-2. In addition, the high voltage signal applied to the input terminal of second inverter 220 is inverted, and the resulting low voltage signal is applied to the gate terminal of first pass transistor 230 and to the upper terminal of second pass transistor 240. Under these operating conditions, first pass transistor 230 is turned on, thereby passing the low output voltage from first inverter 210 to the input terminal of output driver 112-2, second pass transistor 240 is turned off, and isolation switch 114-2 is turned off, thereby causing the positive supply rail of output driver 112-2 to float. Due to the low voltage signal at its input terminal, output driver 112-2 (because it is inverting) couples its floating positive supply rail to circuit output terminal 102. Again, by selectively isolating positive voltage source VPOS from the positive supply rail of output driver 112-2, the present invention provides a high voltage level shifter that prevents current flow to ground (i.e., through NMOS pass transistor 260).

Figure 3:
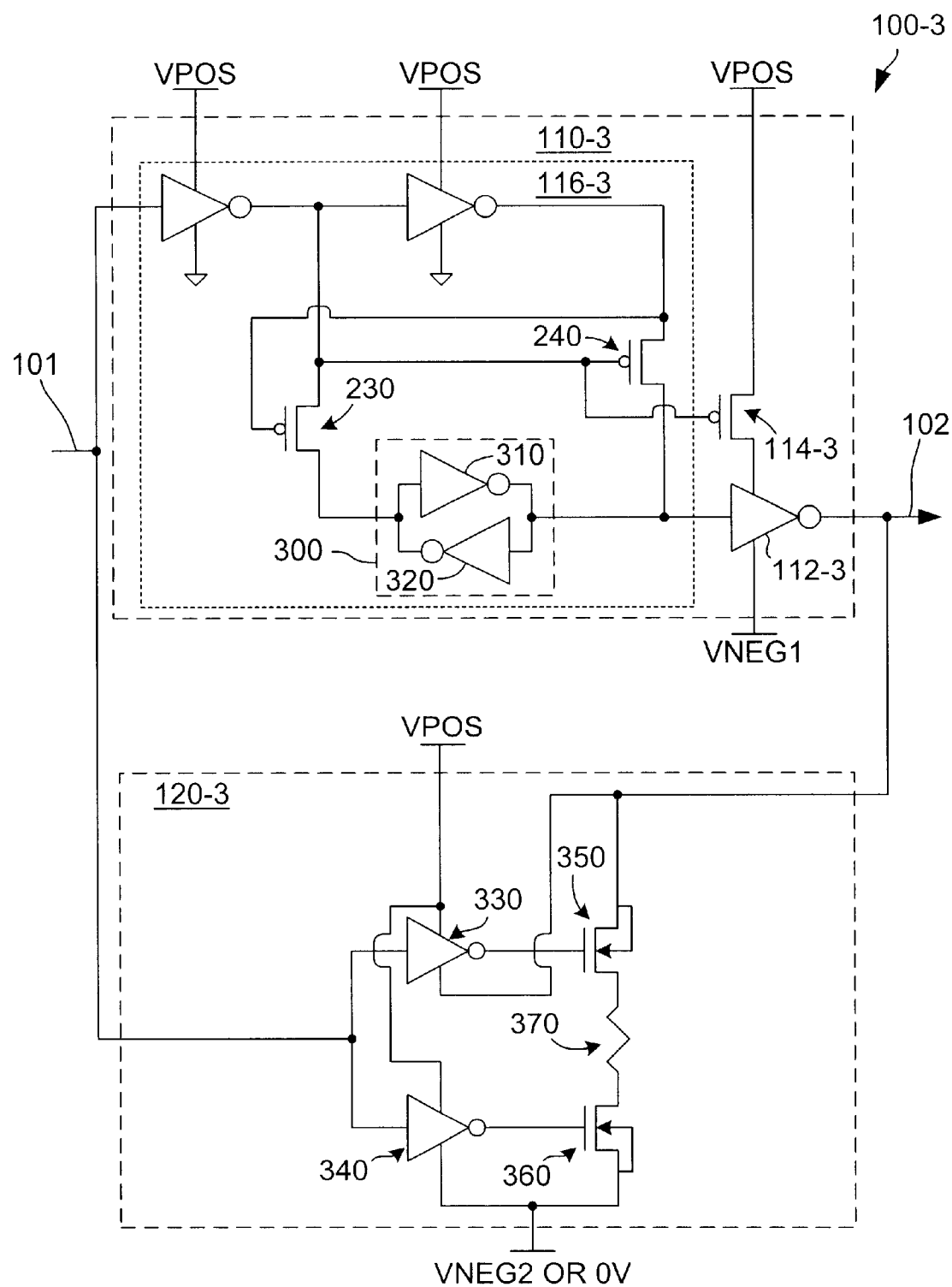
FIG. 3 is a simplified circuit diagram showing a high voltage level shifter according to another embodiment of the present invention.

FIG. 3 is a simplified circuit diagram showing a high voltage level shifter 100-3 according to a second embodiment of the present invention. Like the previously described embodiment, high voltage level shifter 100-3 includes a first voltage shifting circuit 110-3 that is connected in parallel to a second voltage shifting circuit 120-3 between circuit input terminal 101 and circuit output terminal 102.

First voltage shifting circuit 110-3 includes an output driver 112-3, an isolation switch 114-3, and an output control circuit 116-3 that are similar to corresponding components utilized in first voltage shifting circuit 110-2 (see FIG. 2 and above discussion), which are identified with like reference numerals. However, output control circuit 116-3 differs from output control circuit 116-2 of high voltage level shifter 100-2 in that it includes a latch 300 having a first terminal connected to the lower terminal of first pass transistor 230, and a second terminal connected to the lower terminal of second pass transistor 240 and the input terminal of output driver 112-3. In one embodiment, latch 300 includes cross-coupled inverters 310 and 320 that store the data values passed by first pass transistor 230 and second pass transistor 240 in the first and second operating modes, described above. Otherwise, the operation of high voltage level shifter 100-3 is essentially the same as that of high voltage level shifter 100-2, described above.

Referring to the lower portion of FIG. 3, second voltage shifting circuit 112-3 includes a first inverter 330, a second inverter 340, a first triple-well NMOS transistor 350, and a second triple-well NMOS transistor 360. The input terminals of first inverter 330 and second inverter 340 are connected to circuit input terminal 101. The positive supply rail of first inverter 330 connected to positive voltage source VPOS, and the negative supply rail of first inverter 330 is connected to circuit output terminal 102. The output terminal of first inverter 330 is connected to the gate terminal of first triple-well NMOS transistor 350, which has a source/body connected to circuit output terminal 102. The positive supply rail of second inverter 340 is also maintained one threshold voltage below system voltage VCC, but the negative supply rail of second inverter 340 is connected to second negative voltage source VNEG2 (or ground). The output terminal of second inverter 340 is connected to the gate terminal of second triple-well NMOS transistor 360, which has a drain/body connected to circuit output terminal 102. Note that an optional triple P-well resistor 370 is provided between the drain of first triple-well NMOS transistor 350 and the source of second triple-well NMOS transistor 360.

In operation, second voltage shifting circuit 112-3 selectively connects circuit output terminal 102 to second negative voltage source VNEG2 (or ground) in response to a logic "0" signal applied to circuit input terminal 101.

Specifically, the logic "0" input signal is inverted by first inverter 330 and second inverter 340 (i.e., positive voltage source VPOS is passed), and the resulting high voltage signal turns on first triple-well NMOS transistor 350 and second triple-well NMOS transistor 360, thereby connecting circuit output terminal 102 to second negative voltage source VNEG2 (or ground). Conversely, when a logic "1" is applied to circuit input terminal 101, first inverter 330 couples circuit output terminal 102 (which is maintained at first negative voltage VNEG1, as described above) to the gate terminal of first triple-well NMOS transistor 350, and second inverter 340 couples second negative voltage source VNEG2 (or ground) to the gate terminal of second triple-well NMOS transistor 360, thereby securely turning off first triple-well NMOS transistor 350 and second triple-well NMOS transistor 360. Accordingly, second voltage shifting circuit 120-3 isolates circuit output circuit 102 from the second negative voltage source VNEG2 (or ground) using series connected triple-well NMOS transistors 350 and 360. Because the negative supply rail of first inverter 330 is connected to circuit output terminal 102, both the drain and gate terminals of triple-well NMOS transistor 350 are maintained at first negative voltage VNEG1 when first negative voltage source VNEG1 is connected to circuit output terminal 102 by first voltage shifting circuit 110-3.

Optional triple P-well resistor 370, which is provided between the drain of first triple-well NMOS transistor 350 and the source of second triple-well NMOS transistor 360, is described in additional detail in co-owned and co-pending U.S. patent application Ser. No. 09/603,458, filed Jun. 22, 2000, entitled "BITLINE LATCH SWITCHING CIRCUIT FOR FLOATING GATE MEMORY DEVICE REQUIRING ZERO VOLT PROGRAMMING VOLTAGE", which is incorporated herein in its entirety.

Figure 4:
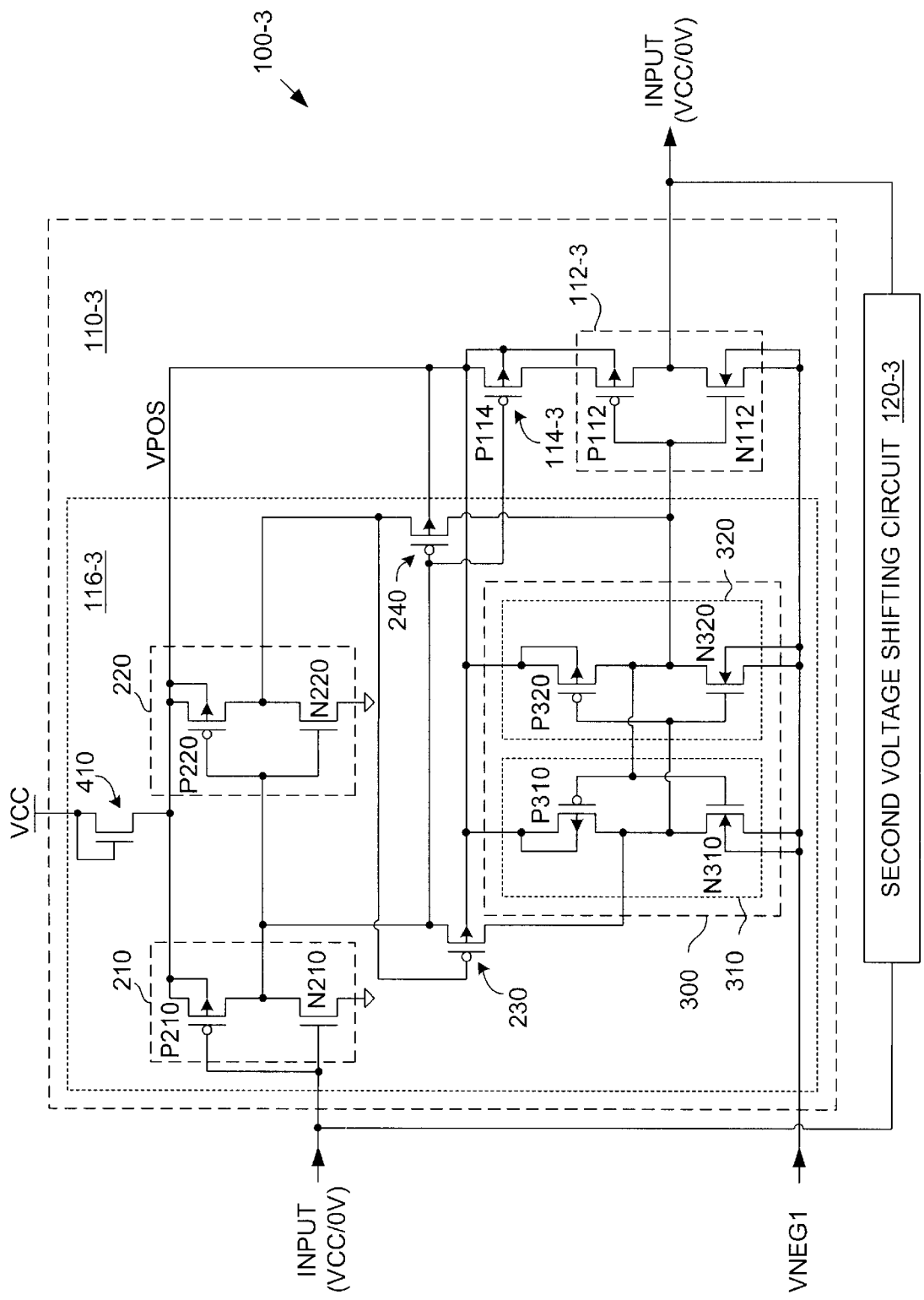
FIG. 4 is a circuit diagram showing the high voltage level shifter of FIG. 3 in additional detail.

FIG. 4 is a circuit diagram showing first voltage shifting circuit 110-3 of high voltage level shifter 100-3 in additional detail.

As indicated in FIG. 4, output driver 112-3 is an inverter formed by a PMOS transistor P112 and an NMOS transistor N112, and isolation circuit 114-3 is formed by PMOS transistor P114. The body of NMOS transistor N112 is connected to negative voltage source VNEG1, and the body of PMOS transistor P112 is connected to positive voltage source VPOS, as is the body of PMOS transistor P114 of isolation switch 114-3.

Referring to output control circuit 116-3, first inverter 210 is formed by PMOS transistor P210 and NMOS transistor N210, and second inverter 220 is formed by PMOS transistor P220 and NMOS transistor N220. The bodies of PMOS transistors P210 and P220 are also connected to positive voltage source VPOS, as are the bodies of first PMOS pass transistor 230 and second pass transistor 240.

Inverters 310 and 320 of latch 300 are formed by PMOS transistors P310 and P320, and NMOS transistor N310 and N320, respectively. Note that the lower terminals and bodies of NMOS transistors N310 and N320 are connected to negative voltage source VNEG1, and the upper terminals and bodies of PMOS transistors P310 and P320 are connected to positive voltage source VPOS. By forming inverters 310 and 320 in this manner, latch 300 provides the additional function of providing sufficient voltage (either VPOS or VNEG1) at the input terminal of output driver 112-3 to assure efficient switching of PMOS transistor P112 and NMOS transistor N112.

In addition to the component shown in FIG. 3, high voltage level shifter 100-3 utilizes an NMOS pass transistor 410 connected between a system voltage VCC (e.g., 3.3 Volts) to provide positive source VPOS at one threshold voltage drop below system voltage (i.e., approximately 2.2 Volts). By reducing the positive voltage supplied to high voltage level shifter 100-3, the potential applied across the various transistors shown in FIG. 4 is reduced, thereby facilitating smaller transistors.

Although the invention has been described in connection with the present embodiments, it is understood that this invention is not limited to the embodiment disclosed, but is capable of various modifications that would be apparent to a person skilled in the art. For example, isolation switch 114 is depicted as an NMOS pass transistor indicated in the embodiment shown in FIG. 1, and as a PMOS pass transistor in the embodiments shown in FIGS. 2, 3, and 4. In yet other embodiments (not shown), the function of isolation switch 114 may be implemented using other switching circuitry known to those of ordinary skill in the art. Thus, the invention is limited only by the following claims.

I claim:

1. A high voltage level-shifter including a plurality of voltage shifting circuits connected in parallel between a circuit input terminal and a circuit output terminal, wherein at least one of the voltage shifting circuits comprises:

an output driver having an output terminal connected to the circuit output terminal, a first supply rail connected to a first voltage source, and a second supply rail;

an isolation switch connected between the second supply rail of the output driver and a second voltage source; and an output control circuit connected between the circuit input terminal and an input terminal of the output driver, wherein, when a first voltage level is applied to the circuit input terminal, the output control circuit closes the isolation switch, thereby coupling the second supply rail to the second voltage source, and causes the output driver to couple the first supply rail to the circuit output terminal, thereby transmitting the first voltage source onto the circuit output terminal, and wherein, when a second voltage level is applied to the circuit input terminal, the output control circuit opens the isolation switch, thereby isolating the second supply rail from the second voltage source, and causes the output driver to couple the first supply rail to the circuit output terminal, thereby causing the output terminal of the output driver to float.

2. The high voltage level-shifter according to claim 1, wherein the isolation switch is a pass transistor.

3. The high voltage level-shifter according to claim 1, wherein the first voltage source is a negative voltage source, and
the second voltage source is a positive voltage source.

4. The high voltage level-shifter according to claim 1, wherein a second voltage shifting circuit of the plurality of voltage shifting circuits comprises:

a second output driver having an output terminal connected to the circuit output terminal, a first supply rail connected to a third voltage source, and a second supply rail;

a second isolation switch connected between the second supply rail of the second output driver and the second voltage source; and a second output control circuit connected between the circuit input terminal and an input terminal of the second output driver, wherein, when the first voltage level is applied to the circuit input terminal, the second output control circuit opens the second isolation switch, thereby isolating the second supply rail of the second output driver from the second voltage source, and causes the second output driver to couple its first supply rail to the circuit output terminal, thereby causing the output terminal of the second output driver to float, and wherein, when the second voltage level is applied to the circuit input terminal, second output control circuit closes the second isolation switch, thereby coupling the second supply rail of the second output driver to the second voltage source, and causes the second output driver to couple its first supply rail to the circuit output terminal, thereby transmitting the third voltage source onto the circuit output terminal.

5. The high voltage level-shifter according to claim 4, wherein the third voltage source is a negative voltage source, and the second voltage source is a positive voltage source.

6. A high voltage level shifter comprising:

a first buffer having an input terminal connected to receive an input signal;

a second buffer having an input terminal connected to an output terminal of the first buffer;

output driver having an input terminal, an output terminal, a positive supply rail, and a negative supply rail connected to a negative voltage source;

a first pass transistor having a first terminal connected to the output terminal of the first buffer, a second terminal connected to the input terminal of the output driver, and a gate terminal connected to an output terminal of the second buffer;

a second pass transistor having a first terminal connected to the output terminal of the second buffer, a second terminal connected to the input terminal of the output driver, and a gate terminal connected to an output terminal of the first buffer; and an isolation switch having a first terminal connected to a positive voltage source, a second terminal connected to the positive supply rail of the output driver, and a gate terminal connected to an output terminal of the first buffer.

7. The high voltage level shifter according to claim 6, wherein the first and second buffers and the output driver comprise inverters, and wherein the first and second pass transistors and the isolation switch comprise PMOS pass transistors.

8. The high voltage level shifter according to claim 6, wherein each of the first buffer and the second buffer further comprise a positive supply rail connected to the positive voltage source, and a negative supply rail connected to ground.

9. The high voltage level shifter according to claim 6, wherein the first and second buffers, the output driver, the first and second pass transistors, and the isolation switch comprise a first voltage shifting circuit, wherein the high voltage level shifter further comprises a second voltage shifting circuit connected in parallel with the first voltage shifting circuit between a circuit input terminal and a circuit output terminal, wherein when the input signal has a first voltage level, the isolation switch passes the positive voltage source to the positive supply rail of the output driver, and the negative voltage source is passed from the negative supply rail of the output driver to the circuit output terminal, and wherein when the input signal has a second voltage level, the isolation switch is opened such that the positive supply rail of the output driver is floating and is passed to the output terminal of the third buffer, and the second voltage shifting circuit connects the circuit output terminal to a non-positive voltage source.

10. The high voltage level shifter according to claim 9, wherein the second voltage shifting circuit comprises:

a third buffer having an input terminal connected to the circuit input terminal; and a third pass transistor connected between the circuit output terminal and the non-positive voltage source, wherein an output terminal of the third buffer is connected to gate terminal of the third pass transistor such that when the input signal has the second voltage level, the third buffer generates an output signal that turns on the third pass transistor to connect the circuit output terminal to the non-positive voltage source.

11. The high voltage level shifter according to claim 10, wherein the second voltage shifting circuit further comprises:

a fourth buffer having an input terminal connected to the circuit input terminal; and a fourth pass transistor connected in series between the third pass transistor and the non-positive voltage source, wherein an output terminal of the fourth buffer is connected to gate terminal of the fourth pass transistor such that when the input signal has the second voltage level, the fourth buffer generates an output signal that turns on the fourth pass transistor to connect the circuit output terminal to the non-positive voltage source through both the third and fourth pass transistors.

12. The high voltage level shifter according to claim 11, wherein the third pass transistor comprises a triple-well NMOS transistor having a source and a body connected to the circuit output terminal, and wherein the fourth pass transistor comprises a triple-well NMOS transistor having a drain and a body connected to the non-positive voltage source.

13. A high voltage level shifter comprising:

a first buffer having an input terminal connected to receive an input signal;

a second buffer having an input terminal connected to an output terminal of the first buffer;

an output driver having an input terminal, an output terminal, a positive supply rail, and a negative supply rail connected to a negative voltage source;

a first pass transistor having a first terminal connected to the output terminal of the first buffer, and a gate terminal connected to an output terminal of the second buffer;

a latch having a first terminal connected to a second terminal of the first pass transistor, and a second terminal connected to the input terminal of the output driver;

a second pass transistor having a first terminal connected to the output terminal of the second buffer, a second terminal connected to the input terminal of the output driver and to the second terminal of the latch, and a gate terminal connected to an output terminal of the first buffer; and an isolation switch having a first terminal connected to a positive voltage source, a second terminal connected to the positive supply rail of the output driver, and a gate terminal connected to an output terminal of the first buffer.

14. The high voltage level shifter according to claim 13, wherein the latch comprises cross-coupled inverters.

15. The high voltage level shifter according to claim 14, wherein each of the cross-coupled inverters comprises a PMOS transistor having a body connected to the positive voltage source, and an NMOS transistor having a body connected to the negative voltage source.

16. The high voltage level shifter according to claim 13,
wherein the first and second buffers comprise inverters having negative supply rails connected to ground,
wherein the output driver comprises an inverter having a negative supply rail connected to the negative voltage source, and
wherein the first and second pass transistors and the isolation switch comprise PMOS pass transistors having bodies connected to the positive voltage source.

17. The high voltage level shifter according to claim 13,
wherein the latch, the first and second buffers, the output driver, the first and second pass transistors, and the isolation switch comprise a first voltage-shifting circuit,
wherein the high voltage level shifter further comprises a second voltage shifting circuit connected in parallel with the first voltage shifting circuit between a circuit input terminal and a circuit output terminal,
wherein when the input signal has a first voltage level, the isolation switch passes the positive voltage source to the positive supply rail of the output driver, and the negative voltage source is passed from the negative supply rail of the output driver to the circuit output terminal, and
wherein when the input signal has a second voltage level, the isolation switch is opened such that the positive supply rail of the output driver is floating, and the output driver is biased to couple the floating positive supply rail to the circuit output terminal, and the second voltage shifting circuit connects the circuit output terminal to a non-positive voltage source.

18. The high voltage level shifter according to claim 17, wherein the second voltage shifting circuit comprises:
a third buffer having an input terminal connected to the circuit input terminal; and
a third pass transistor connected between the circuit output terminal and the non-positive voltage source,
wherein an output terminal of the third buffer is connected to gate terminal of the third pass transistor such that when the input signal has the second voltage level, the third buffer generates an output signal that turns on the third pass transistor to connect the circuit output terminal to the non-positive voltage source.

19. The high voltage level shifter according to claim 18, wherein the second voltage shifting circuit further comprises:
a fourth buffer having an input terminal connected to the circuit input terminal; and
a fourth pass transistor connected in series between the third pass transistor and the non-positive voltage source,
wherein an output terminal of the fourth buffer is connected to gate terminal of the fourth pass transistor such that when the input signal has the second voltage level, the fourth buffer generates an output signal that turns on the fourth pass transistor to connect the circuit output terminal to the non-positive voltage source through both the third and fourth pass transistors.

20. The high voltage level shifter according to claim 19,
wherein the third pass transistor comprises a triple-well NMOS transistor having a source and a body connected to the circuit output terminal, and
wherein the fourth pass transistor comprises a triple-well NMOS transistor having a drain and a body connected to the non-positive voltage source.

* * * * *